(12) United States Patent
Hamabe (10) Patent No.: US 11,463,895 B2
(45) Date of Patent: Oct. 4, 2022

(54) RADIO WAVE ENVIRONMENT DISPLAY DEVICE AND RADIO WAVE ENVIRONMENT DISPLAY METHOD

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 125 days.

(21) Appl. No.: 17/065,751

(22) Filed: Oct. 8, 2020

(65) Prior Publication Data

US 2021/0029565 A1 Jan. 28, 2021

Related U.S. Application Data

(63) Continuation of application No. PCT/JP2019/015365, filed on Apr. 8, 2019.

(30) Foreign Application Priority Data

Apr. 10, 2018 (JP) .............................. JP2018-075633

(51) Int. Cl.
*H04W 24/08* (2009.01)
*H04B 17/318* (2015.01)
*H04L 43/045* (2022.01)

(52) U.S. Cl.
CPC .......... *H04W 24/08* (2013.01); *H04B 17/318* (2015.01); *H04L 43/045* (2013.01)

(58) Field of Classification Search
CPC .... H04W 24/08; H04W 16/18; H04B 17/318; H04B 17/23; H04L 43/045; G01R 29/08
See application file for complete search history.

(56) References Cited

U.S. PATENT DOCUMENTS

2009/0239532 A1 9/2009 Ebata
2018/0351631 A1 12/2018 Hamabe et al.

FOREIGN PATENT DOCUMENTS

JP 2005-073149 3/2005
JP 2006-352385 12/2006

(Continued)

OTHER PUBLICATIONS

International SearchReport dated Jul. 9, 2019 in International (PCT) Application No. PCT/JP2019/015365 with English translation.

(Continued)

*Primary Examiner* — Peter P Chau
(74) *Attorney, Agent, or Firm* — Wenderoth, Lind & Ponack, L.L.P.

(57) ABSTRACT

A radio wave environment display device includes a receiver configured to receive: a first measurement result of radio wave intensity including a frequency and a measurement position of a first radio wave transmitted from a radio transmitter corresponding to radio identification information designated by a user; and second measurement results of radio wave intensity including frequencies and a measurement position of waves including the first radio wave. The device further includes a processor configured to: select at least one second measurement result corresponding to at least one radio wave, other than the first radio wave, having a frequency the same as or in the vicinity of that of the first radio wave; and cause a display to display thereon a difference between the first measurement result and the at least one second measurement result as a radio wave environment at the measurement position of the first radio wave.

5 Claims, 5 Drawing Sheets

(56) References Cited

FOREIGN PATENT DOCUMENTS

| JP | 2010-147867 | | | 7/2010 |
|----|-------------|---|---|--------|
| JP | 2013-190280 | | | 9/2013 |
| JP | 2015177436 | A | * | 10/2015 |
| JP | 2015177437 | A | * | 10/2015 |
| JP | 2015177438 | A | * | 10/2015 |
| JP | 2015186110 | A | * | 10/2015 |
| KR | 20060063411 | A | * | 6/2006 |
| WO | 2017/134715 | | | 8/2017 |

OTHER PUBLICATIONS

Written Opinion of the International Searching Authority dated Jul. 9, 2019 in International (PCT) Application No. PCT/JP2019/015365.

* cited by examiner

RADIO WAVE ENVIRONMENT DISPLAY DEVICE AND RADIO WAVE ENVIRONMENT DISPLAY METHOD

CROSS-REFERENCES TO RELATED APPLICATIONS

This application is a continuation of PCT International Patent Application No. PCT/JP2019/015365 filed on Apr. 8, 2019, which claims the benefit of priority of Japanese Patent Application No. 2018-075633 filed on Apr. 10, 2018, the enter contents of which are incorporated herein by reference.

FIELD

The present disclosure relates to a radio wave environment display device and a radio wave environment display method.

BACKGROUND

JP-A-2006-352385 discloses a method for recognizing quality of reception from each of plural base stations installed in an area that is a target of estimation at each of very small intervals obtained by dividing the area. JP-A-2006-352385 discloses a method for inferring an area where a handover will occur by detecting a handover condition by referring to the difference between reception quality at each very small interval and another very small interval adjacent to it.

SUMMARY

The concept of the present disclosure has been conceived in view of the above circumstances in the art, and an object of the disclosure is therefore to provide a radio wave environment display device and a radio wave environment display method that assist proper measurement of a radio wave environment by eliminating influences of disturbing waves existing in a measurement target area in measuring a radio wave environment for a desired radio wave transmitted from a radio transmitter and traveling through the area.

The disclosure provides a radio wave environment display device including a receiver configured to receive: a first measurement result of radio wave intensity including a frequency and a measurement position of a first radio wave transmitted from a radio transmitter corresponding to radio identification information designated by a user; and second measurement results of radio wave intensity including frequencies and a measurement position of waves including the first radio wave; and a processor configured to: select at least one second measurement result corresponding to at least one radio wave, other than the first radio wave, having a frequency that is the same as or in the vicinity of the frequency of the first radio wave from the second measurement results; and cause a display to display thereon a difference between the first measurement result and the at least one second measurement result as a radio wave environment at the measurement position of the first radio wave.

The disclosure also provides a radio wave environment display method in a radio wave environment display device, including: receiving a first measurement result of radio wave intensity including a frequency and a measurement position of a first radio wave transmitted from a radio transmitter corresponding to radio identification information designated by a user; receiving second measurement results of radio wave intensity including frequencies and a measurement position of waves including the first radio wave; selecting at least one second measurement result corresponding to at least one radio wave, other than the first radio wave, having a frequency that is the same as or in the vicinity of a frequency corresponding to frequency of the first radio wave from the second measurement results; and causing a display to display thereon a difference between the first measurement result and the at least one second measurement result as a radio wave environment at the measurement position of the first radio wave.

The disclosure makes it possible to assist proper measurement of a radio wave environment by eliminating influences of disturbing waves existing in a measurement target area in measuring a radio wave environment for a desired radio wave transmitted from a radio transmitter and traveling through the area.

DETAILED DESCRIPTION (Introduction to the Content of Embodiment 1)

For example, a technique for measuring radio wave reception quality (in other words, radio wave environment) at each position in an area such as a factory, an office, a store, or the like when a radio wave is transmitted (radiated) from an access point provided in the area is being studied. The access point transmits (radiates) a signal (a radio wave) for wireless communication that complies with a wireless LAN (local area network) such as WiFi (registered trademark). There may occur a situation that not only a radio wave desired by a user (i.e., a radio wave transmitted from a target access point (measurement target)) but also disturbing waves (i.e., radio waves transmitted from signal sources that is not a target of measurement) are traveling through such an area. To measure radio wave reception quality, it would be necessary to take influences of disturbing waves into consideration. In the above-described JP-A-2006-352385, no consideration is given to measuring reception quality taking influences of disturbing waves into consideration.

In view of the above, a first embodiment will be described below which is directed to an example radio wave environment display device and radio wave environment display method that assist proper measurement of a radio wave environment by eliminating influences of disturbing waves existing in a measurement target area in measuring a radio wave environment for a desired radio wave transmitted from a radio transmitter and traveling through the area.

An embodiment as a specific disclosure of a radio wave environment display device and a radio wave environment display method according to the present disclosure will be hereinafter described in detail by referring to the drawings when necessary. However, unnecessarily detailed descriptions may be avoided. For example, detailed descriptions of already well-known items and duplicated descriptions of constituent elements having substantially the same ones already described may be omitted. This is to prevent the following description from becoming unnecessarily redundant and thereby facilitate understanding of those skilled in the art. The following description and the accompanying drawings are provided to allow those skilled in the art to understand the disclosure thoroughly and are not intended to restrict the subject matter set forth in the claims.

In the first embodiment, a radio wave measuring device is disposed at each of positions in a measurement target area in which visualization of a radio wave environment is intended, and radio waves transmitted from various signal sources, including a radio wave transmitted (radiated) from an access point corresponding to a desired radio identification information designated by a person who is going to measure a radio wave environment (hereinafter referred to as a "user"), are received by the radio wave measuring device. A PC (an example of a term "radio wave environment display device") that is connected to the radio wave measuring device determines reception quality of a radio wave transmitted from the above-mentioned access point at a position where the radio wave measuring device is disposed on the basis of reception quality (described later) of radio waves received by the radio wave measuring device and displayed the determined reception quality on a display.

The term "radio wave" as used herein is not limited to a radio wave corresponding to a radio signal in a frequency band of a desired wireless LAN such as WiFi (registered trademark) and includes a radio wave corresponding to a radio signal in a frequency band that is the same as or in the vicinity of that frequency band (in other words, a radio signal that may interfere with that radio signal). The term "radio wave environment" means reception quality at each position in a measurement target area that is obtained by calculation processing performed by the radio wave environment display device when a radio wave are transmitted (radiated) from the access point corresponding to the desired radio identification information (i.e., desired wireless LAN). For example, the term "reception quality" means signal power (in other words, reception electric field intensity) of a received signal.

Figure 1:
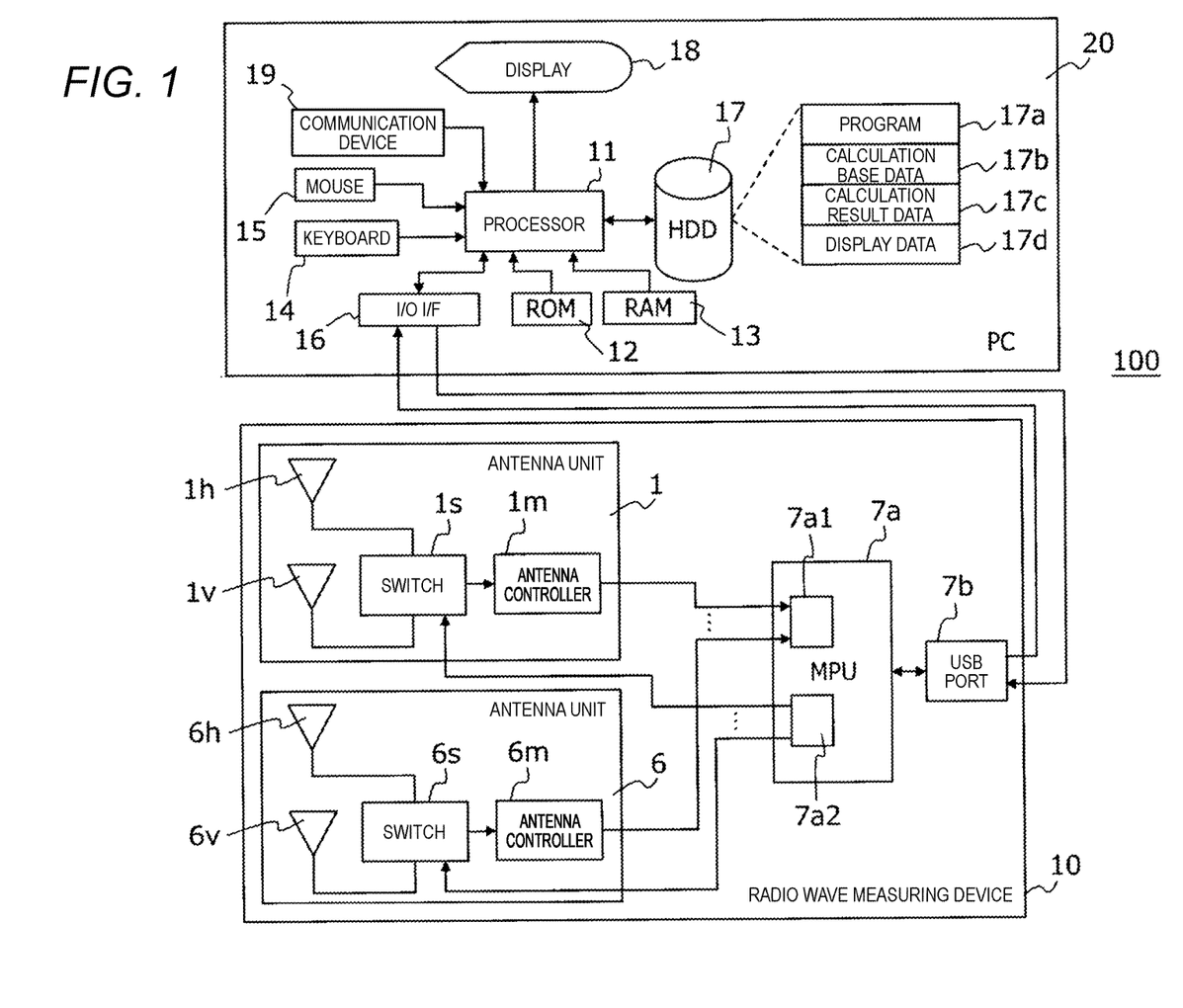
FIG. 1 is a block diagram showing example hardware configurations of a radio wave measuring device and a PC employed in a first embodiment, respectively.

First, the configuration of the a radio wave environment measuring system 100 according to the first embodiment will be described with reference to FIGS. 1 and 2. FIG. 1 is a block diagram showing example hardware configurations of a radio wave measuring device 10 and a PC 20 employed in the first embodiment, respectively. As shown in FIG. 1, the radio wave environment measuring system 100 is configured so as to include the radio wave measuring device 10 and the PC 20.

Figure 2:
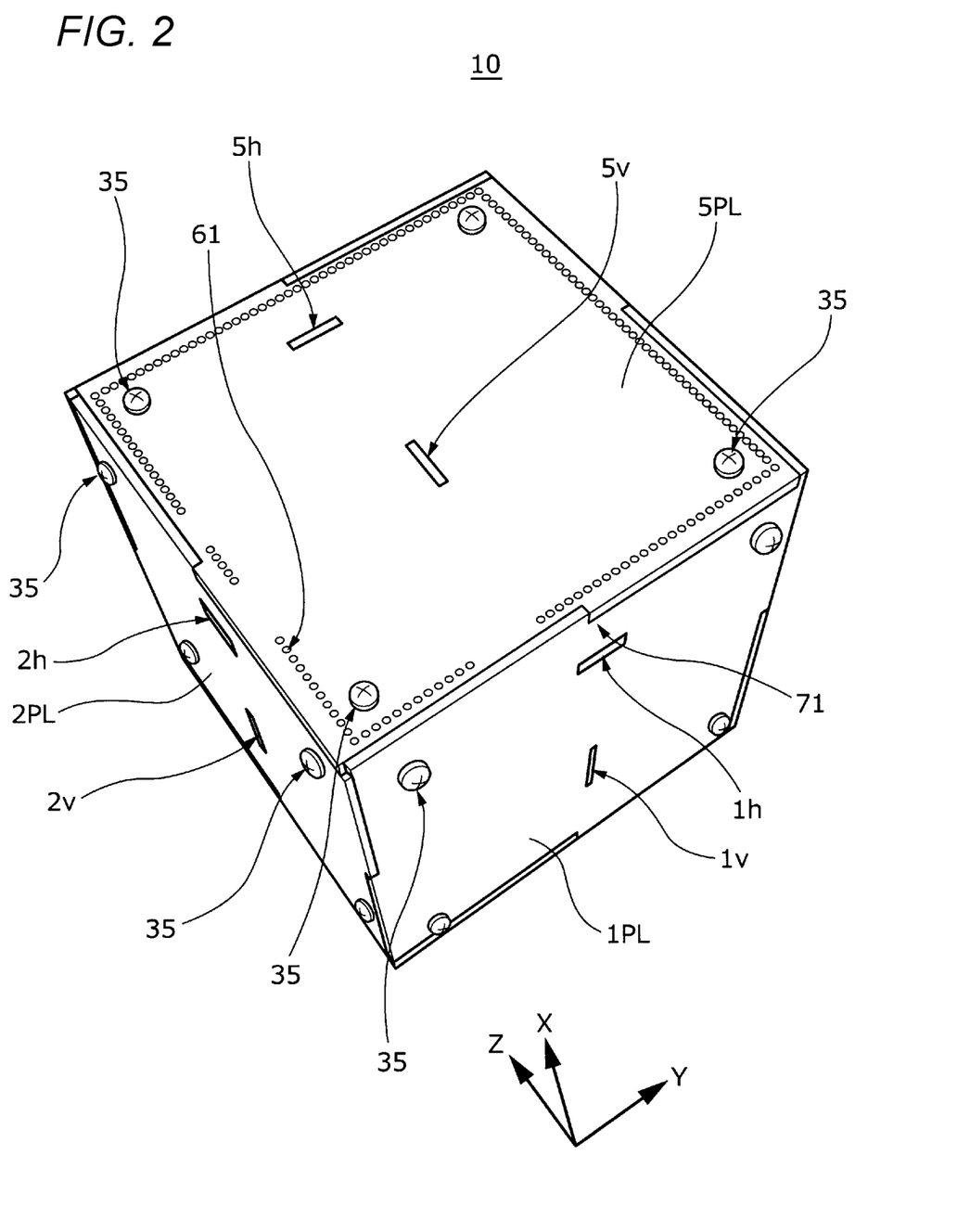
FIG. 2 is a perspective view showing an appearance of the radio wave measuring device employed in the first embodiment.

FIG. 2 is a perspective view showing an appearance of the radio wave measuring device 10 employed in the first embodiment. In the first embodiment, for example, the directions of the X axis, the Y axis, and the Z axis coincide with the directions indicated by arrows shown in FIG. 2. For example, the +X direction and the −X direction correspond to the top-bottom direction of a body of the radio wave measuring device 10, the −Y direction and the +Y direction correspond to the left-right direction of the body of the radio wave measuring device 10, and the −Z and the +Z direction correspond to the front-rear direction the body of the radio wave measuring device 10.

As shown in FIG. 2, the radio wave measuring device 10 has the body that is shaped like a polyhedron such as a rectangular prism shape (e.g., cuboid or cube) and is provided with antenna units 1, ..., 6 that correspond to a total of six surfaces (more specifically, front surface 1PL, left surface 2PL, rear surface, right surface, top surface SPL, and bottom surface) that constitute the body. One surface (e.g., bottom surface) of the body of the radio wave measuring device 10 is fixed to a stage (not shown) directly or with a certain interval and the stage is provided with wheels. As such, the radio wave measuring device 10 is can be moved easily as it performs measurement in an area.

As shown in FIG. 1, the radio wave measuring device 10 is configured so as to include the antenna units 1-6, an MPU 7a, and a USB (Universal Serial Bus) port 7b. Since the antenna units 1-6 have the same configuration, to simplify the description the antenna unit 1 will be described as an example. In the following description of the antenna unit 1, each constituent element may read as a corresponding one of another antenna unit.

The antenna unit 1 includes a horizontally polarized antenna $1h$, a vertically polarized antenna $1v$, a switch $1s$, and an antenna controller $1m$.

The horizontally polarized antenna $1h$ receives a horizontally polarized component of a radio wave (main signal WV1) being transmitted from an access point AP1 (see FIG. 3) corresponding to desired radio identification information through a measurement target area and horizontally polarized components of radio waves (described later) being transmitted from various signal sources, more specifically, horizontally polarized waves in a prescribed frequency band (e.g., 1.9-2.4 GHz band). The horizontally polarized antenna $1h$ is electrically connected to the switch $1s$ (not shown in FIG. 2).

The vertically polarized antenna $1v$ receives a vertically polarized component of the radio wave (main signal WV1) being transmitted from the access point AP1 (see FIG. 3) corresponding to the desired radio identification information through the measurement target area and vertically polarized components of the radio waves being transmitted from the various signal sources, more specifically, vertically polarized waves in the prescribed frequency band (e.g., 1.9-2.4 GHz band). The vertically polarized antenna $1v$ is electrically connected to the switch $1s$ (not shown in FIG. 2).

The switch $1s$ connects the horizontally polarized antenna $1h$ or the vertically polarized antenna $1v$ to the antenna controller $1m$ according to a switching signal that is output from a switching controller $7a2$ of the MPU $7a$ time-divisionally for each of the surfaces constituting the body of the radio wave measuring device 10. In other words, the switch is outputs an output of the horizontally polarized antenna $1h$ or the vertically polarized antenna $1v$ to the antenna controller $1m$ according to the above-mentioned switching signal.

The antenna controller $1m$ is configured using a circuit capable of processing a radio signal that complies with any of various wireless communication methods for the above-mentioned 1.9-2.4 GHz frequency band. Examples of the above wireless communication methods are wireless LANs of DECT (Digital Enhanced Cordless Telecommunications), Bluetooth (registered trademark), WiFi (registered trademark), etc. The antenna controller $1m$ takes out, as parallel-format data, an output (e.g., signal power or reception electric field intensity) of the horizontally polarized antenna 1*h* or the vertically polarized antenna 1*v* which is connected to the switch 1*s*, and outputs the parallel-format data to a data converter 7*a*1 of the MPU 7*a*.

The MPU (microprocessing unit) 7*a*, which functions as a controller of the radio wave measuring device 10, performs control processing for controlling the operations of the individual units of the radio wave measuring device 10 in a centralized manner, data input/output processing with the individual units of the radio wave measuring device 10, data calculation processing, and data storing processing. The MPU 7*a* includes the data converter 7*a*1 and the switching controller 7*a*2.

When a measurement command for measurement of signal power of a signal having radio identification information (e.g., SSID (service set identifier)) designated by a user is sent from the PC 20, the MPU 7*a* receives the measurement command via a USB port 7*b*. Upon receiving the measurement command, the MPU 7*a* makes a transition to a measurement mode and controls the individual units of the radio wave measuring device 10 to start a measurement of signal power of a signal (i.e., above-mentioned main signal WV1) having the SSID designated by the user.

When a measurement command (e.g., scan mode measurement command) for measurement of signal power values of radio waves transmitted from the various signal sources (see FIG. 3) including the access point AP1 of the above-mentioned main signal WV1 is sent from the PC 20, the MPU 7*a* receives the measurement command via the USB port 7*b*. Upon receiving the measurement command, the MPU 7*a* makes a transition to a scan mode and controls the individual units of the radio wave measuring device 10 to start a measurement of signal power values of a signal (i.e., above-mentioned main signal WV1) having the SSID designated by the user and radio waves transmitted from the various signal sources.

The data converter 7*a*1, which is configured using, for example, a UART (Universal Asynchronous Receiver/Transmitter) circuit, converts parallel-format data that is output from each of the antenna controllers (e.g., antenna controllers 1*m*-6*m*) into serial-format data. The resulting data (e.g., signal power values or reception electric field intensity values of radio waves transmitted from the various signal sources including the access point AP1) is input, via the USB port 7*b*, to the PC 20 which is connected to the radio wave measuring device 10. Alternatively, the resulting data may be input to, instead of the PC 20, a measuring instrument (e.g., spectrum analyzer or network analyzer; not shown) that is connected via the USB port 7*b*.

The switching controller 7*a*2 generates, time-divisionally, switching signals for inputting outputs of the horizontally polarized antenna and the vertically polarized antenna installed on each of the surfaces of the radio wave measuring device 10 to the MPU 7*a*. Having a GPIO (General-Purpose Input/Output) terminal, the switching controller 7*a*2 outputs switching signals (mentioned above) generated time-divisionally to the switch provided on each surface (e.g., each of the switches 1*s*-6*s*) via the GPIO terminal. In this manner, switching signals allow an output value of only one of a total of 12 antennas of the radio wave measuring device 10 to be input to the MPU 7*a* exclusively. That is, an output of the horizontally polarized antenna 1*h* of the antenna unit 1, an output of the vertically polarized antenna 1*v* of the antenna unit 1, . . . , an output of the horizontally polarized antenna 6*h* of the antenna unit 6, and an output of the vertically polarized antenna 6*v* of the antenna unit 6 can be input to the MPU 7*a* in this order periodically at prescribed intervals.

The USB port 7*b* connects the radio wave measuring device 10 and the PC 20.

Although the above description is directed to the example case that the radio wave measuring device 10 receives radio waves, the radio wave measuring device 10 may be considered to have a configuration for transmitting radio waves. That is, the radio wave measuring device 10 may perform switching so as to use the antenna units 1-6 time divisionally and, furthermore, transmit radio waves from the horizontally polarized antenna and the vertically polarized antenna of each antenna unit time divisionally.

The radio wave measuring device 10 has, as main members, laminated boards as surface members providing the respective surface and a frame body provided inside the body of the radio wave measuring device 10. The laminated boards and the frame body constitute the body (polyhedron such as a hexahedron) of the radio wave measuring device 10. For example, the body of the radio wave measuring device 10 assumes a hexahedron; FIG. 2 shows an example case that it assumes a cube. The laminated boards are attached to the respective surfaces of a frame body of a cube by fixing screws 35, for example.

The surface members that constitute the body of the radio wave measuring device 10 is not limited to laminated boards. The polyhedron is not limited to a hexahedron and may be a tetrahedron, a dodecahedron, or the like.

In the radio wave measuring device 10, antennas (horizontally polarized antenna and vertically polarized antenna) are installed on each of the laminated board that is disposed so as to form the top surface SPL, the laminated boards that are disposed so as to form the four respective side surfaces (e.g., front surface 1PL, left surface 2PL, right surface, and rear surface), and the laminated board that is disposed so as to form the bottom surface. Configured in this manner, the radio wave measuring device 10 can receive radio waves that come in from a total of six directions. Where radio waves are measured with the radio wave measuring device 10 fixed to a prescribed mounting surface, the laminated board having antennas may be omitted on the bottom surface of the radio wave measuring device 10.

The antennas installed on each laminated board are dipole antennas, for example. The dipole antennas are formed on, for example, the surface of each laminated board and dipole antenna patterns are formed by, for example, etching a metal foil formed on the surface. Each of the plural layers is a copper foil, a glass epoxy layer, or the like.

For example, horizontally polarized antennas 1*h*-6*h* that operate in a 1.9 to 2.4 GHz band and vertically polarized antennas 1*v*-6*v* that operate in the 1.9 to 2.4 GHz band are installed on the surface (top layer) of each laminated board of the cubic body of the radio wave measuring device 10.

An AMC (Artificial Magnetic Conductor) is used to form each laminated board. The AMC is an artificial magnetic conductor having a PMC (Permanent Magnetic Conductor) characteristic and is formed as a prescribed metal pattern. The use of the AMC makes it possible to dispose the antennas of the radio wave measuring device 10 parallel with the associated laminated board and thereby reduce the overall size. Furthermore, the AMC can increase the gain of the antennas because reception of radio waves coming from the other directions can be prevented by a ground conductor.

In the radio wave measuring device 10, plural grounding via conductors 61 are arranged straightly alongside the edge of each of the four sides of each laminated board. The grounding via conductors 61 may be arranged at the same intervals. Furthermore, the grounding via conductors 61 may be arranged at a pitch (interval) that is long enough to interrupt radio waves coming from outside the radio wave measuring device 10. The grounding via conductors 61 are formed so as to penetrate through the laminated board from its top surface to its bottom surface.

Each laminated board of the radio wave measuring device 10 is formed so as to assume a rectangular shape, for example. Each side of each laminated board is formed with a recess and a projection that are bounded by one step 71 formed at the center of the side and extend along the side. That is, as shown in FIG. 2, the body of the radio wave measuring device 10 is formed by fitting the projection and the recess of one of adjacent laminated boards into and with the recess and the projection of the other, respectively.

The PC 20 which is an example radio wave environment display device is connected to the radio wave measuring device 10 by a real cable (e.g., USB cable) and receives reception quality (e.g., signal power or reception electric field intensity) of radio waves received by the radio wave measuring device 10. Using the reception quality of the received radio waves, the PC 20 calculates and displays a radio wave environment (e.g., SINR (signal-to-interference-plus-noise ratio); described later)) of a main signal WV1 (see FIG. 3) at the position, where the radio wave measuring device 10 is disposed, in the measurement target area.

The PC 20 is configured so as to include a processor 11, a ROM 12, a RAM 13, a keyboard 14, a mouse 15, an input/output interface (I/O I/F) 16, an HDD (hard disk drive) 17, and a display 18. The ROM 12, the RAM 13, the keyboard 14, the mouse 15, the input/output interface 16, the HDD 17, and the display 18 each connected to the processor 11 by an internal bus or the like so as to be able to exchange data or information with the processor 11.

For example, the processor 11 is configured using a CPU (central processing unit), an MPU (microprocessing unit), a DSP (digital signal processor), or an FPGA (field-programmable gate array). The processor 11, which functions as a controller of the PC 20, performs control processing for controlling the operations of the individual units of the PC 20 in a centralized manner, processing for exchanging data or information with the individual units of the PC 20, data calculation processing, and processing for storing data or information. The processor 11 operates according to programs 17a stored in the HDD 17. Using the ROM 12 and the RAM 13 while it performs processing, the processor 11 outputs, and displays, calculation result data 17c generated by calculation processing (described later) to the display 18.

The processor 11, which is an example selector, selects at least one reception quality measurement result (second measurement result) having a frequency that is the same as or in the vicinity of a frequency (channel) of a main signal WV1 as an example of a first radio wave and corresponding to radio waves (see FIG. 3) other than the main signal WV1 from reception quality measurement results (hereinafter referred to "second measurement results") of radio waves obtained from the radio wave measuring device 10 in the scan mode.

The processor 11 as an example controller calculates, through calculation processing, the difference (what is called SINR) between a reception quality measurement result (hereinafter referred to as a "first measurement result") indicating radio wave intensity of a main signal WV1 at the position where the radio wave measuring device 10 is disposed and the selected second measurement result. The processor 11 displays the calculated difference (SINR) on the display 18 as a radio wave environment for the main signal WV1 at the position where the radio wave measuring device 10 is disposed.

The ROM 12, which is a read-only memory, is stored with OS (operating system) programs and data in advance. The OS programs are executed upon a start of the PC 20.

The RAM 13, which is a writable and readable memory, is used as a work memory during processing of calculating various radio wave environments (see FIG. 6) and temporarily holds data or information that is used or generated at the time processing of calculating various radio wave environments.

The keyboard 14 and the mouse 15, which are example manipulation input devices, function as human interfaces with the user and receives manipulations of the user. In other words, the keyboard 14 and the mouse 15 are used for making various settings for various kinds of processing to be performed by the PC 20.

The input/output interface 16, which is an example receiver, operates as an interface for performing input/output of data or information with the radio wave measuring device 10. The input/output interface 16 receives, from the radio wave measuring device 10, radio wave intensity measurement result (first measurement result) including a frequency and a measurement position of a main signal WV1 that is transmitted from the access point AP1 (see FIG. 3) corresponding to radio identification information (described later) designated by the user and sends it to the processor 11. The input/output interface 16 receives, from the radio wave measuring device 10, radio wave intensity measurement results including frequencies and measurement positions (second measurement results) of various kinds of radio waves including a main signal WV1 (mentioned above) and sends them to the processor 11.

The HDD 17 stores the programs 17a for execution of radio wave environment calculation processing (see FIG. 6), calculation base data 17b to be used for the radio wave environment calculation processing, calculation result data 17c corresponding to results of the radio wave environment calculation processing, and display data 17d generated on the basis of the calculation result data 17c. The calculation base data 17b includes, for example, information of a formula to be used for calculating an SINR (described above), data of a map or a layout of a measurement target area, information relating to radio waves transmitted from various signal sources, traveling through the measurement target area, and to be received by the communication device 19, and information relating to the access point AP1 corresponding to the desired radio identification information of the user.

The programs 17a for execution of radio wave environment calculation processing are read out from the HDD 17 into the RAM 13 via the processor 11 and run by the processor 11. Alternatively, the programs 17a may be recorded in a recording medium (e.g., CD-ROM; not shown) other than the HDD 17 and read into the RAM 13 by a corresponding reading device (e.g., CD-ROM driving device; not shown).

The display 18, which is an example display, is configured using a display device such as an LCD (liquid crystal display) or an organic EL (electroluminescence) display. Having a function of human interfacing with the user, the display 18 displays details of various settings, an operation state of the PC 20, various calculation results, and display data 17d corresponding to calculation results.

The communication device 19 receives radio waves being transmitted (i.e., traveling) through the measurement target area where the PC 20 is disposed, extracts pieces of information relating to radio wave intensity (e.g., signal power or reception electric field intensity), a frequency, and a signal source (e.g., the SSID corresponding to the access point AP1) of the received radio waves using known techniques, for example, and outputs the extraction results to the processor 11. The extraction results are displayed on the display 18 by the processor 11 in the form of a radio wave list of radio waves received by the PC 20.

Figure 3:
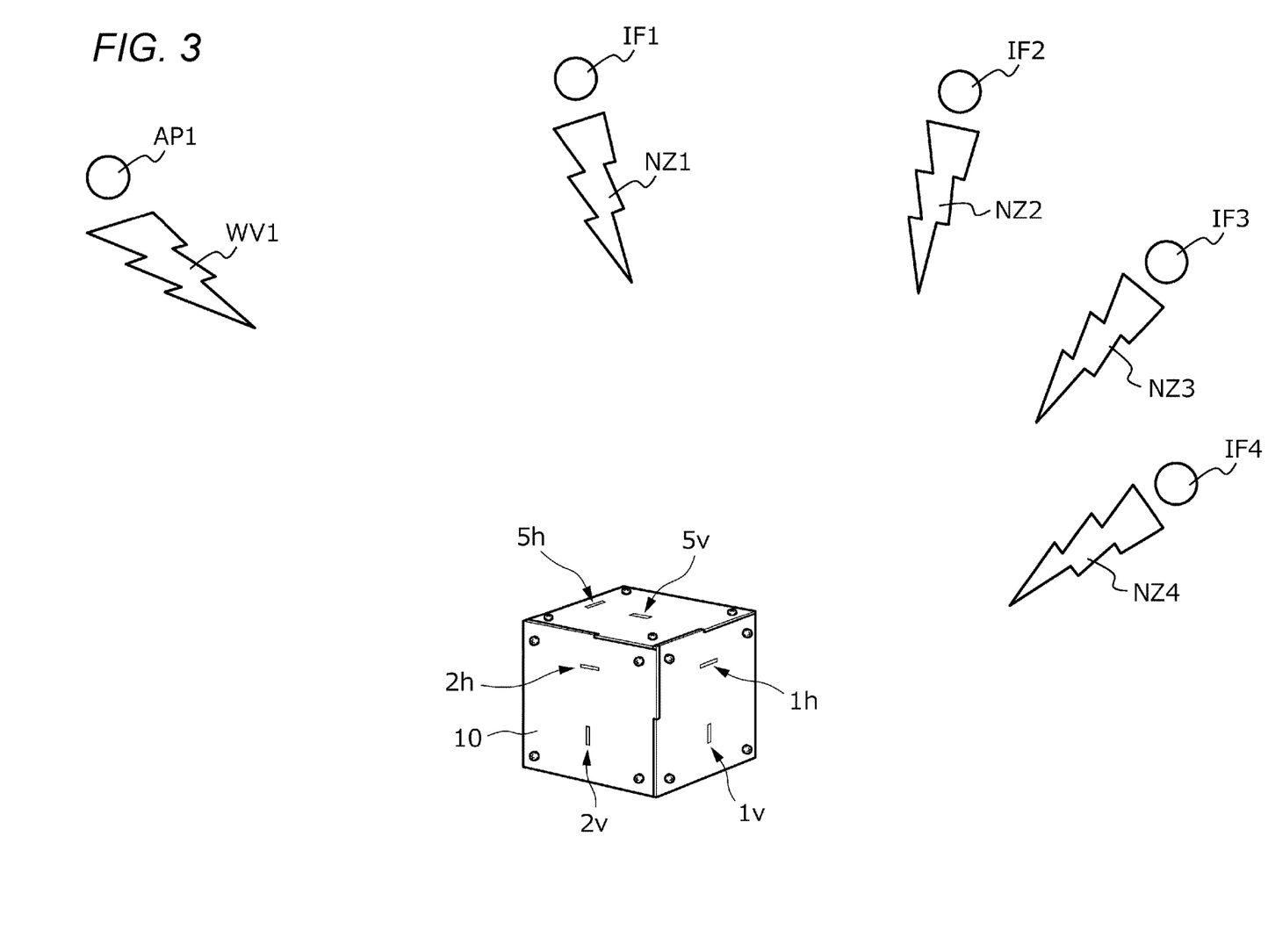
FIG. 3 is an explanatory diagram showing the radio wave measuring device, a desired access point, and signal sources of disturbing waves.
Figure 4:
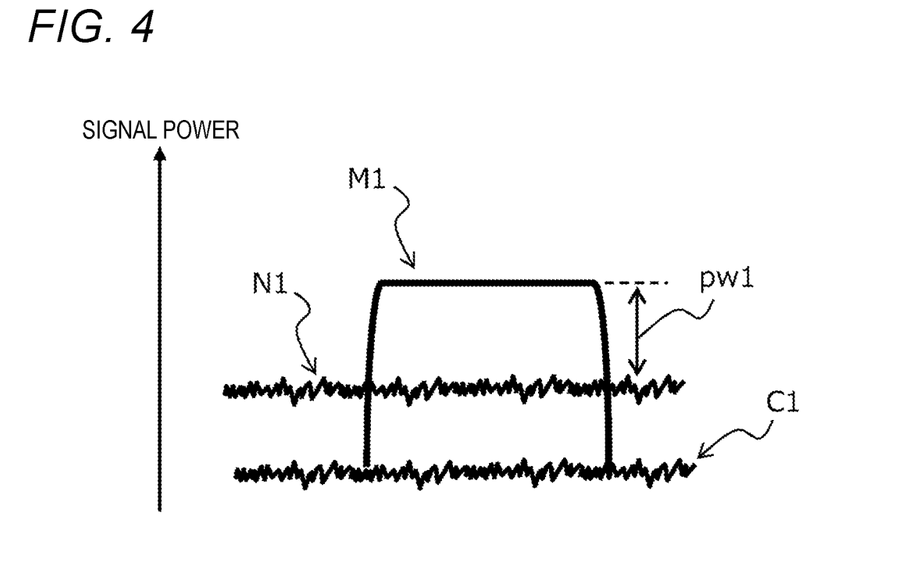
FIG. 4 is a graph showing example signal power values of a main signal, disturbing waves, and stationary waves.
Figure 5:
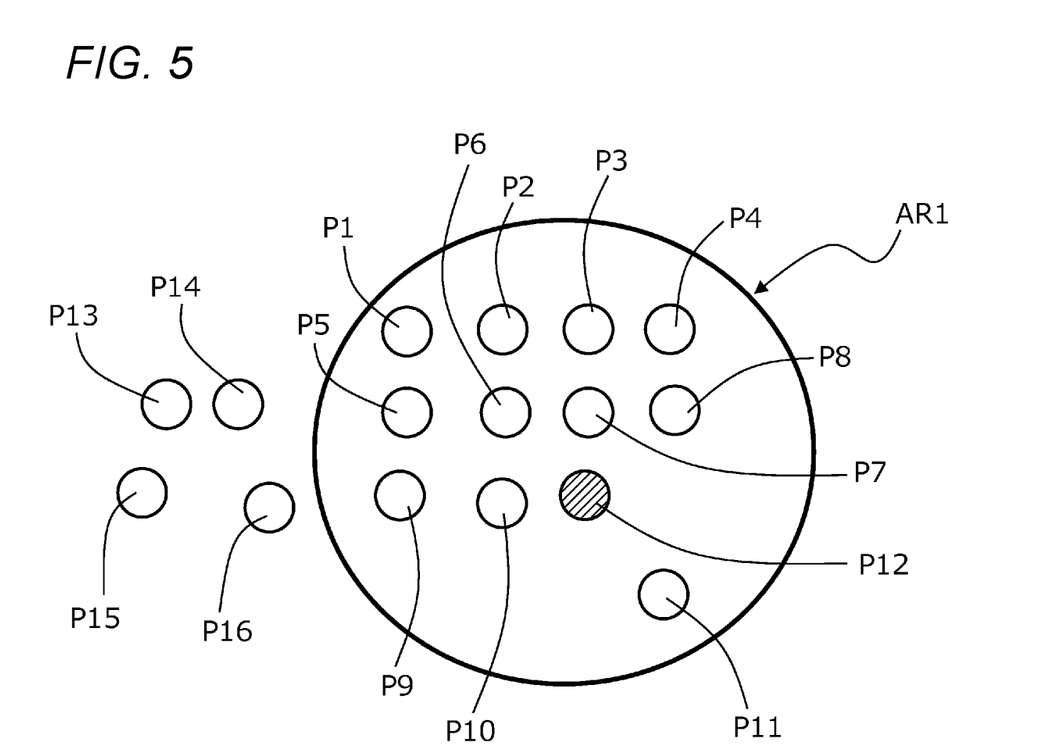
FIG. 5 is an explanatory diagram showing an example prescribed area to become a target of a scan mode operation.

Next, an operation of measuring radio wave intensity (in other words, reception quality) of a main signal WV1 in the radio wave environment measuring system 100 according to the first embodiment will be outlined with reference to FIGS. 3, 4, and 5. FIG. 3 is an explanatory diagram showing the radio wave measuring device 10, a desired access point AP1, and signal sources IF1, IF2, IF3, and IF4 of disturbing waves NZ1, NZ2, NZ3, and NZ4. FIG. 4 is a graph showing example signal power values of a main signal WV1, disturbing waves NZ1, NZ2, NZ3, and NZ4, and stationary waves. FIG. 5 is an explanatory diagram showing an example prescribed area AR1 to become a target of a scan mode operation.

The position of the radio wave measuring device 10 employed in the first embodiment is changed so that it is disposed at measurement target positions (an example of a term "measurement positions") in a measurement target area in order. As shown in FIG. 3, the horizontally polarized antennas 1h, 2h, 5h, and 6h (not shown) and the vertically polarized antenna 1v, 2v, . . . , 5v, and 6v (not shown) installed on the respective surfaces of the hexahedral body of the radio wave measuring device 10 receive, in addition to a main signal WV1 transmitted from the access point AP1, radio waves (i.e., disturbing waves NZ1, NZ2, NZ3, and NZ4) transmitted from the signal sources IF1, IF2, IF3, and IF4.

The access point AP1 is a radio transmitter that transmits a radio signal (i.e., main signal WV1) that the user wants to be made a measurement target and has a frequency corresponding to desired radio identification information (e.g., SSID). In the following, it is assumed that the main signal WV1 is a signal that complies with a wireless LAN such as WiFi (registered trademark). The signal sources IF1-IF4 are radio transmitters that transmit signals (i.e., disturbing waves) that have frequencies the same as or in the vicinities of frequencies of the main signal WV1 (in other words, frequencies that are the same as all or part of the frequencies of the main signal WV1) and hence may interfere with the main signal WV1.

For example, where the main signal WV1 has frequencies of a wireless LAN (e.g., 2.4-GHz band), the disturbing waves NZ1, NZ2, and NZ3 are radio signals of a 2.0-GHz band that are compatible with Bluetooth (registered trademark) and the disturbing wave NZ4 is a radio signal of a 1.9-GHz band that is compatible with DECT. The combination of disturbing waves NZ1-NZ4 is not limited to this combination.

As shown in FIG. 4, signal power M1 of a main signal WV1 is larger than signal power N1 that is the sum of signal power values of radio waves NZ1-NZ4 that are disturbing waves and signal power C1 of stationary waves (noise) existing stationary in the measurement target area. To facilitate understanding of the description, it is assumed that in FIG. 4 the signal power is in decibel.

Incidentally, it would be inappropriate to use the magnitude of the signal power M1 itself of the main signal WV1 shown in FIG. 4 as reception quality at the position, where the radio wave measuring device 10 is disposed, in the measurement target area. This is because the magnitude of the signal power M1 of the main signal WV1 is decreased being affected by the signal power values of the disturbing waves NZ1-NZ4 that interfere with the main signal WV1. In view of this, the PC 20 according to the first embodiment calculates, as a radio wave environment (e.g., SINR) at the position where the signal power M1 of the main signal WV1 has been obtained, signal power pw1 by subtracting the magnitude of the sum of the signal power values of the disturbing waves NZ1-NZ4 from the magnitude of the signal power M1 of the main signal WV1. Alternatively, signal power pw1 may be calculated by subtracting an average value, over a prescribed time, of the magnitude of the sum of the signal power values of radio waves NZ1-NZ4 from an average value, over the prescribed time, of the magnitude of the signal power M1 of the main signal WV1.

As shown in FIG. 5, in measuring reception quality of a main signal WV1, as described above the position of the radio wave measuring device 10 employed in the first embodiment is changed so that it is disposed at positions P1, P2, P3, P4, P5, P6, P7, P8, P9, P10, P11, P12, P13, P14, P15, and P16 in the measurement target area. In the measurement mode, the radio wave measuring device 10 can determine (measure), in a short time (e.g., about 1 to 2 sec), reception quality of a main signal WV1 received at each position. Thus, the PC 20 can quickly receive reception quality of a main signal WV1 that is received by the radio wave measuring device 10 disposed at each of the positions P1-P16.

On the other hand, in the scan mode, it is difficult for the radio wave measuring device 10 to determine (measure), in a short time (e.g., about 1 to 2 sec), reception quality values of a main signal WV1 and various disturbing waves NZ1-NZ4 received at one position. More specifically, in the scan mode, quick calculation of a radio wave environment is difficult because it takes about 2 to 3 minutes for the radio wave measuring device 10 to make a measurement at one position.

In view of the above, as shown in FIG. 5, the PC 20 according to the first embodiment cause the radio wave measuring device 10 to perform a scan mode measurement not at all of the positions P1-P16 in the measurement target area but at at least one position (e.g., position P12) in a prescribed area AR1. In other words, in calculating a radio wave environment (e.g., SINR) of the main signal WV1 at each of the positions P1-P12 in the prescribed area AR1, the PC 20 uses a measurement result of reception quality measured at, for example, the position P12 in the scan mode as signal power values of disturbing waves NZ1-NZ4. Furthermore, the PC 20 causes the radio wave measuring device 10 to perform a scan mode measurement at at least one position in a second prescribed area (not shown) that is different from the prescribed area AR1. The prescribed area AR1 and the second prescribed area may either overlap or not overlap with each other. There may exist plural prescribed areas (first prescribed area, second prescribed area, third prescribed area, . . . ) such as the prescribed area AR1. Whereas the total measurement time can be made shorter as the number of prescribed areas decreases, more accurate measurement results can be obtained as the number of prescribed areas increases. Although it is desirable that the plural prescribed areas cover the entire measurement target area, an area having no measurement position need not be covered. Where a position where a measurement has been performed belongs to plural prescribed areas (e.g., prescribed area AR1 and second prescribed area), the PC 20 employs a reception quality measurement result obtained in the scan mode at a nearest position.

This is based on an inference that there are no large differences between radio wave intensity values (signal power or reception electric field intensity values) of disturbing waves NZ1-NZ4 at positions in the prescribed area AR1. More specifically, steps St7-St11 shown in FIG. 6 (described later) which are executed in the scan mode may be executed at at least one position (e.g., position P12) in the prescribed area AR1. In other words, steps St7-St11 of the process shown in FIG. 6 may be omitted in the case where the radio wave measuring device 10 is disposed at a position excluding one position (e.g., position P12) in the prescribed area AR1.

With the above measure, since the PC 20 need not cause the radio wave measuring device 10 to perform a scan mode measurement at the positions other than the position P12 (i.e., positions P1-P11) among the positions P1-P12 in the prescribed area AR1, a radio wave environment at each position can be determined quickly.

Figure 6:
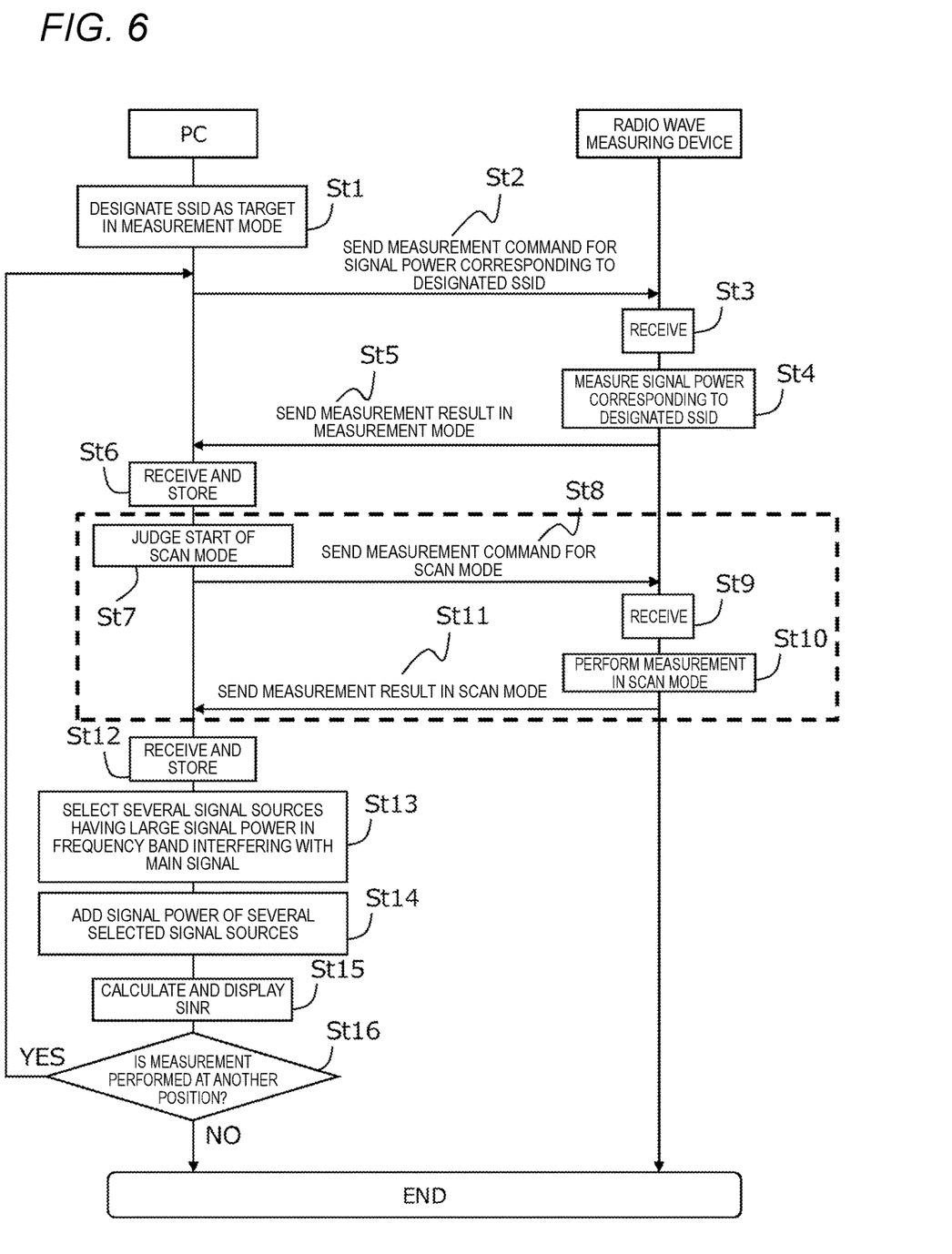
FIG. 6 is a sequence diagram for time-series description of an example operation procedure of measurement of a radio wave environment by the radio wave measuring device and the PC employed in the first embodiment.

Next, an operation procedure of measurement of a radio wave environment in the radio wave environment measuring system 100 according to the first embodiment will be described with reference to FIG. 6. FIG. 6 is a sequence diagram for time-series description of an example operation procedure of measurement of a radio wave environment by the radio wave measuring device 10 and the PC 20 employed in the first embodiment. It is assumed for the description to be made with reference to FIG. 6 that the radio wave measuring device 10 is disposed at a measurement target position in a measurement target area by the user, the communication device 19 of the PC 20 receives radio waves being transmitted through the measurement target area, and the PC 20 displays on the display 18, in the form of a radio wave list, extraction results of pieces of information relating to radio wave intensity, a frequency, and a signal source of the received radio waves (i.e., radio signal).

Referring to FIG. 6, the PC 20 receives designation of radio identification information (e.g., SSID) of an access point AP1 corresponding to a main signal WV1 that is a target in the measurement mode, the designation being made by a user from a radio wave list displayed on the display 18 by a manipulation using the keyboard 14 or the mouse 15 (SU). The PC 20 generates a measurement command for the measurement mode in which to measure signal power of a main signal WV1 that is transmitted from the access point AP1 corresponding to the SSID designated at step St1, and sends the generated measurement command to the radio wave measuring device 10 (St2).

The radio wave measuring device 10 receives the measurement command that was sent from the PC 20 at step St2 (St3), and measures, in the measurement mode, signal power of a main signal WV1 transmitted from the access point AP1 corresponding to the SSID indicated by the measurement command at a position of the device 10 (St4). The radio wave measuring device 10 sends, to the PC 20, a result (first measurement result) of the measurement of signal power of the main signal WV1 that was made in the measurement mode at step St4 (St5).

The PC 20 receives the first measurement result sent from the radio wave measuring device 10 at step St5 and stores it in the HDD 17 (St6).

After the execution of step St6, the PC 20 terminates the measurement mode and judges that the scan mode should be started (St7). The PC 20 generates a measurement command for the scan mode in which to measure signal power values of a main signal WV1 and various radio signals (e.g., main signal WV1 and disturbing waves NZ1-NZ4 shown in FIG. 3) and sends the generated measurement command to the radio wave measuring device 10 (St8).

The radio wave measuring device 10 receives the measurement command that was sent from the PC 20 at step St8 (St9), and measures, in the scan mode, signal power values of all radio signals (e.g., main signal WV1 and disturbing waves NZ1-NZ4) designated by the measurement command at the position where the device 10 is disposed (St10). The radio wave measuring device 10 sends, to the PC 20, results (second measurement results) of the measurement of signal power values of all the radio signals that was made in the scan mode at step St10 (St11).

The PC 20 receives the second measurement results that were sent from the radio wave measuring device 10 at step St11 and stores them in the HDD 17 (St12). The PC 20 selects plural (e.g., two or three) signal sources each of which transmitted (radiated) a radio signal having frequencies the same as or in the vicinity of frequencies (channel) of the main signal WV1 received at step St6 (in other words, frequencies at which interference with the main signal WV1 occurs) from the second measurement results received at step St12 (St13).

The PC 20 adds together signal power values of the plural signal sources selected at step St13 (St14), and performs calculation processing to calculate the difference between the signal power of the main signal WV1 stored in the HDD 17 at step St6 and the addition result of the signal power values obtained at step St14 (i.e., SINR shown in FIG. 4) as a radio wave environment at the position where the radio wave measuring device 10 is disposed (St15). The PC 20 displays the SINR calculated at step St15 on the display 18.

After the execution of step St15, if the user wants to measure an SINR of the same main signal WV1 at another position in the measurement target area (St16: yes), the process of the PC 20 returns to step St2. On the other hand, if the user does not want to measure an SINR of the same main signal WV1 at another position in the measurement target area (St16: no), the execution of the process of FIG. 6 is finished. If the user wants to measure an SINR of a main signal WV1, being transmitted, of another access point (not shown) in the measurement target area, an SSID is selected again by the user and hence the process of FIG. 6 is executed again from step St1.

As described above, in the radio wave environment display system 100 according to the first embodiment, the input/output interface 16 of the PC 20 which is an example radio wave environment display device receives a first measurement result of radio wave intensity including a frequency and a measurement position of a main signal WV1 transmitted from the access point AP1 corresponding to radio identification information (e.g., SSID) designated by a user. The input/output interface 16 of the PC 20 also receives second measurement results of radio wave intensity values including frequencies and a measurement position of various kinds of radio waves including the main signal WV1 (e.g., the main signal WV1 and disturbing waves NZ1-NZ4). The processor 11 of the PC 20 selects a second measurement result corresponding to a radio wave, other than the main signal WV1, having a frequency that is the same as or in the vicinity of the frequency of the main signal WV1 from the second measurement results. The processor 11 of the PC 20 displays, on the display 18, a difference between the first measurement result and the selected second measurement result as a radio wave environment at the measurement position of the main signal WV1.

With this configuration, in the radio wave environment measuring system 100, the PC 20 can assist proper measurement of a radio wave environment (e.g., SINR) by eliminating influences of disturbing waves existing in a measurement target area in measuring a radio wave environment for the desired radio wave (main signal WV1) transmitted from the access point AP1 and traveling through the measurement target area.

Where the magnitude of signal power itself of the main signal WV1 is employed as a radio wave environment at a position concerned, if disturbing waves exist that may interfere with the main signal WV1 strongly, the signal power of the main signal WV1 may lower to a large extent being affected by the disturbing waves. That is, even where the signal power itself of the main signal WV1 is large, if the signal power of disturbing waves is large, the SINR at a position concerned becomes small and there may occur a case that data transmitted from another wireless communication device (not shown) cannot be demodulated at that position, resulting in degradation in communication quality. In the first embodiment, since an SINR that is obtained on the basis of signal power of the main signal WV1 at a measurement target position taking influences of disturbing waves and noise into consideration is used as radio wave environment, the PC 20 allows the user to properly judge whether the communication quality of wireless communication is high at the position concerned on the basis of an SINR displayed on the display 18.

If plural second measurement results are selected, the processor 11 of the PC 20 displays, on the display 18, the difference between the first measurement result and an addition result of the plural second measurement results. With this measure, even if plural kinds of disturbing waves that may interfere with the main signal WV1 exist in the measurement target area, the PC 20 can properly calculate an SINR at the measurement position of the main signal WV1 taking signal power values of the plural disturbing waves into consideration.

The input/output interface 16 of the PC 20 receives a first measurement result from a radio wave measuring device (example measuring device) that is disposed at a different measurement position in a prescribed area AR1 of the radio wave environment measurement target area every time radio wave intensity of the main signal WV1 is measured. The input/output interface 16 of the PC 20 also receives second measurement results from the radio wave measuring device 10 disposed at at least one measurement position in the prescribed area AR1 as second measurement results in the prescribed area AR1. With this measure, it suffices that the PC 20 perform a scan mode measurement for measuring radio waves of various signal sources including the main signal WV1 being transmitted through the measurement target area at at least one position in the prescribed area AR1. Since it is not necessary to change the position of the radio wave measuring device 10 in the scan mode unlike in a measurement in the measurement mode, an SINR can be calculated quickly.

Furthermore, the radio wave measuring device 10 which is disposed at a measurement position of radio wave intensity of the main signal WV1 has a polyhedral body in which antenna units 1-6 are installed on respective surfaces thereof. The processor 11 of the PC 20 causes measurement of radio wave environments for the various kinds of radio waves including the first main signal WV1 to be performed on at least one surface of the polyhedral body and causes measurement of a radio wave environment for the main signal WV1 to be performed on the remaining surfaces of the polyhedral body. With this measure, the PC 20 can perform a scan mode measurement for measuring radio waves of various signal sources including the main signal WV1 being transmitted through the measurement target area in the same period as a measurement in the measurement mode. Since it is not necessary to perform a measurement mode measurement and a scan mode measurement individually, an SINR can be calculated quickly.

The present application is based on Japanese Patent Application No. 2018-075633 filed on Apr. 10, 2018, the disclosure of which is invoked herein by reference.

Although the various embodiments have been described above with reference to the drawings, it goes without saying that the disclosure is not limited to those examples. It is apparent that those skilled in the art could conceive various changes, modifications, replacements, additions, deletions, or equivalents within the confines of the claims, and they are naturally construed as being included in the technical scope of the disclosure. Constituent elements of the above-described various embodiments may be combined in a desired manner without departing from the spirit and scope of the invention.

The present disclosure is useful as what discloses a radio wave environment display device and a radio wave environment display method that assist proper measurement of a radio wave environment by eliminating influences of disturbing waves existing in a measurement target area in measuring a radio wave environment for a desired radio wave transmitted from a radio transmitter and traveling through the area.

The invention claimed is:

1. A radio wave environment display device comprising:
a receiver configured to receive:
  a first measurement result of radio wave intensity including a frequency and a measurement position of a first radio wave transmitted from a radio transmitter corresponding to radio identification information designated by a user; and
  second measurement results of radio wave intensity including frequencies and a measurement position of waves including the first radio wave; and
a processor configured to:
  select at least one second measurement result corresponding to at least one radio wave, other than the first radio wave, having a frequency that is the same as or in the vicinity of the frequency of the first radio wave from the second measurement results; and
  cause a display to display thereon a difference between the first measurement result and the at least one second measurement result as a radio wave environment at the measurement position of the first radio wave.

2. The radio wave environment display device according to claim 1,
wherein when a plurality of second measurement results are selected as the at least one second measurement result, the processor is further configured to cause the display to display thereon a difference between the first measurement result and a result obtained by adding the plurality of second measurement results.

3. The radio wave environment display device according to claim 1,
wherein the receiver receives the first measurement result from a measuring device that is disposed at a different measurement position in a prescribed area within a radio wave environment measurement target area every time radio wave intensity of the first radio wave is measured, and
wherein the receiver receives the second measurement results from the measuring device disposed at at least one measurement position in the prescribed area as the second measurement results in the prescribed area.

4. The radio wave environment display device according to claim 1,
- wherein a measuring device which is disposed at the measurement position of the first radio wave comprises a polyhedral body in which antenna units are installed on respective surfaces thereof, and
- the processor causes measurement of radio wave environments for the waves including the first radio wave to be performed on at least one surface of the polyhedral body, and causes measurement of a radio wave environment for the first radio wave to be performed on remaining surfaces of the polyhedral body.

5. A radio wave environment display method in a radio wave environment display device, comprising:
- receiving a first measurement result of radio wave intensity including a frequency and a measurement position of a first radio wave transmitted from a radio transmitter corresponding to radio identification information designated by a user;
- receiving second measurement results of radio wave intensity including frequencies and a measurement position of waves including the first radio wave;
- selecting at least one second measurement result corresponding to at least one radio wave, other than the first radio wave, having a frequency that is the same as or in the vicinity of a frequency corresponding to frequency of the first radio wave from the second measurement results; and
- causing a display to display thereon a difference between the first measurement result and the at least one second measurement result as a radio wave environment at the measurement position of the first radio wave.

* * * * *